(12) United States Patent
Ostermann et al.

(10) Patent No.: US 9,799,583 B2
(45) Date of Patent: Oct. 24, 2017

(54) SEMICONDUCTOR DEVICES AND METHODS OF FORMATION THEREOF

(71) Applicant: Infineon Technologies AG, Neubiberg (DE)

(72) Inventors: Thomas Krotscheck Ostermann, Koestenberg (AT); Andrew Christopher Graeme Wood, St. Jakob i. Rosental (AT); Peter Maier Brandl, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 110 days.

(21) Appl. No.: 14/074,591

(22) Filed: Nov. 7, 2013

(65) Prior Publication Data

US 2015/0123131 A1     May 7, 2015

(51) Int. Cl.
```
H01L 23/34       (2006.01)
H01L 21/3205     (2006.01)
H01L 23/485      (2006.01)
H01L 21/768      (2006.01)
H01L 23/367      (2006.01)
```

(52) U.S. Cl.
CPC .......... *H01L 23/34* (2013.01); *H01L 21/3205* (2013.01); *H01L 21/76805* (2013.01); *H01L 21/76838* (2013.01); *H01L 23/485* (2013.01); *H01L 23/3677* (2013.01); *H01L 2924/0002* (2013.01)

(58) Field of Classification Search
CPC ............. H01L 29/6659; H01L 29/7833; H01L 29/7845; H01L 21/823871; H01L 21/76224; H01L 23/522; H01L 29/7843; H01L 21/823807; H01L 29/7846; H01L 2924/0002; H01L 29/665
USPC .................................................. 257/773–776
See application file for complete search history.

(56) References Cited

U.S. PATENT DOCUMENTS

| | | | |
|---|---|---|---|
| 8,664,725 B1 * | 3/2014 | Venkitachalam | ........................ H01L 21/823412 257/346 |
| 2006/0065969 A1 | 3/2006 | Antol et al. | |
| 2007/0018331 A1 * | 1/2007 | Chen | ..................... H01L 23/562 257/774 |
| 2007/0210453 A1 * | 9/2007 | Large et al. | ................... 257/758 |
| 2009/0166750 A1 * | 7/2009 | Eda | ............................... 257/369 |

* cited by examiner

*Primary Examiner* — Joshua King
*Assistant Examiner* — Mohammed R Alam
(74) *Attorney, Agent, or Firm* — Slater Matsil, LLP

(57) ABSTRACT

In one embodiment, a semiconductor device includes a first contact pad disposed at a top side of a workpiece, a second contact pad disposed at the top side of the workpiece. An isolation region is disposed between the first contact pad and the second contact pad. A metal strip is disposed at least partially within the isolation region. The metal strip is not coupled to an external potential node.

20 Claims, 20 Drawing Sheets

U.S. 9,799,583 B2

SEMICONDUCTOR DEVICES AND METHODS OF FORMATION THEREOF

TECHNICAL FIELD

The present invention relates generally to semiconductor devices, and more particularly to semiconductor devices and methods of formation thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of materials over the semiconductor wafers, patterning the thin films of material, doping selective regions of the semiconductor wafers, and other processes.

Some of the problems related to semiconductor device development relate to area scaling of all geometries and improved thermal conductivity to dissipate heat quickly and/or to monitor control structures.

SUMMARY OF THE INVENTION

In accordance with an embodiment of the present invention, a semiconductor device comprises a first contact pad disposed at a top side of a workpiece, a second contact pad disposed at the top side of the workpiece. An isolation region is disposed between the first contact pad and the second contact pad. A metal strip is disposed at least partially within the isolation region. The metal strip is not coupled to an external potential node.

In accordance with an embodiment of the present invention, a method of forming a semiconductor device comprises forming a trench in an intermediate region between a first contact region and a second contact region. A first contact metal layer is formed over the first contact region and the second contact region. The first contact metal layer is at least partially formed within the trench. A second contact metal layer is formed over the first contact metal layer. The first contact metal layer is removed from the intermediate region without removing all of the first contact metal layer from within the trench.

In accordance with an embodiment of the present invention, a semiconductor device comprises a contact pad disposed at a top side of a workpiece, a first conductive line disposed in a first insulating layer at the top side of the workpiece, and a second conductive line disposed over and overlapping the first conductive line. A contact extends from the second conductive line to the first conductive line. The contact pad comprises a first portion of a first contact metal layer and the contact comprises a second portion of the first contact metal layer.

In accordance with an embodiment of the present invention, a method of forming a semiconductor device comprises forming a first conductive line over a workpiece, forming a second conductive line over the first conductive line, and forming a contact opening from a top surface of the second conductive line. The contact opening extends from the second conductive line to the first conductive line. A contact metal layer is formed over a contact region of the workpiece. The contact metal layer is at least partially formed within the contact opening.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIG. 1A-1D, illustrates a semiconductor device in accordance with an embodiment of the present invention, wherein FIG. 1A illustrates a cross-sectional view and FIGS. 1B and 1C illustrate top views, wherein FIG. 1D illustrates a magnified view;

FIG. 2, which includes

FIG. 3, which includes

FIG. 4, which includes

FIG. 5, which includes

FIG. 6, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Thick metal, for example, greater than 5 μm typically needs wide metal gaps or spacing. The metal spacing has to be wide because of limitations in the lithography and etch processes, and results in many problems. For example, the unused silicon area (area not contributing to the current handling capability or functionality of the chip), increases with chip size and therefore increases the cost of the chips, which is undesirable. Adjacent metal covered regions are (thermally) coupled poorly and trap heat within the substrate of the chip. In various embodiments, the present invention can be used to solve these and other problems, depending on various implementations.

Embodiments of the present invention effectively use a thin metal layer to overcome the above problems without additional processing steps. Accordingly, various embodiments of the present invention use existing underlying barrier layers such as that comprising Ti/TiN and W to form electrical and thermal connections in regions where the overlying thick power metal (such as Al, AlCu, AlSi, AlSiCu, Cu or similar) is etched away. Advantageously, various embodiments of the present invention provide the additional functionality without increasing wafer processing cost and silicon area usage.

Various embodiments of the present invention teach the use of etched recesses in a layer underlying deposited metal layers. These etched recess are filled with a metal that is not removed during subsequent metal etch processes. Specific embodiments of the present invention will next be described.

FIG. 1 will be used to describe a structural embodiment of the present invention. Additional structural embodiments will be described using FIGS. 2I, 3B, 4B, 5E, 6-7. An embodiment of fabricating the device will be described using FIG. 2. Additional embodiments of fabricating the device will be described using FIGS. 2-4, 5.

Figure 1A:
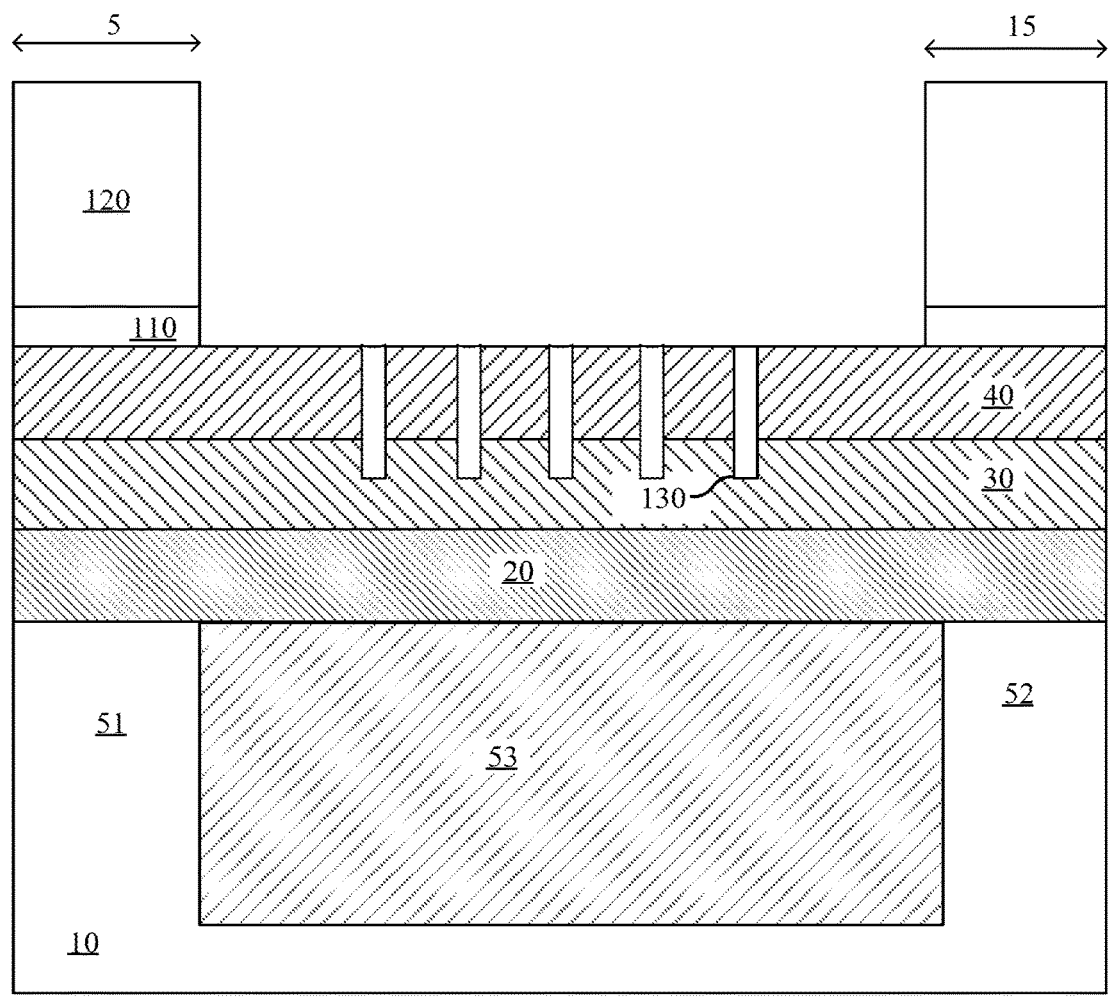
Figure 1B:
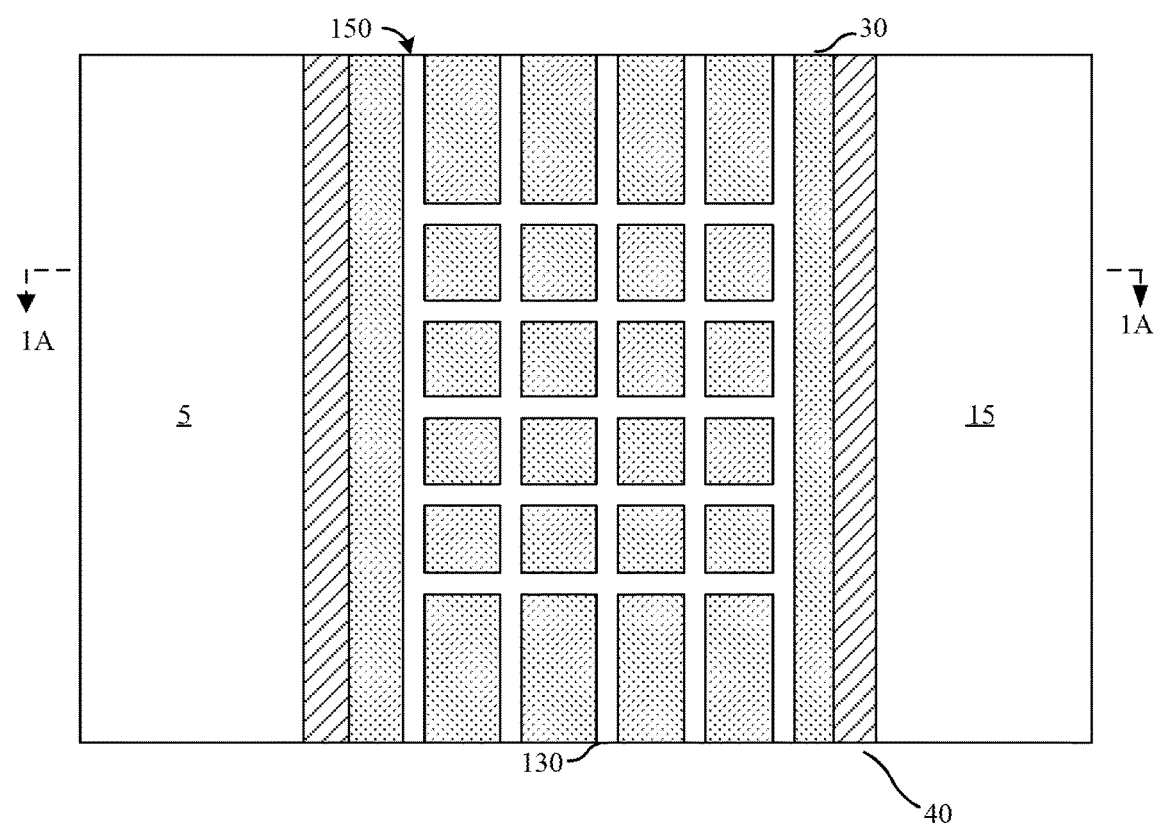
Figure 1C:
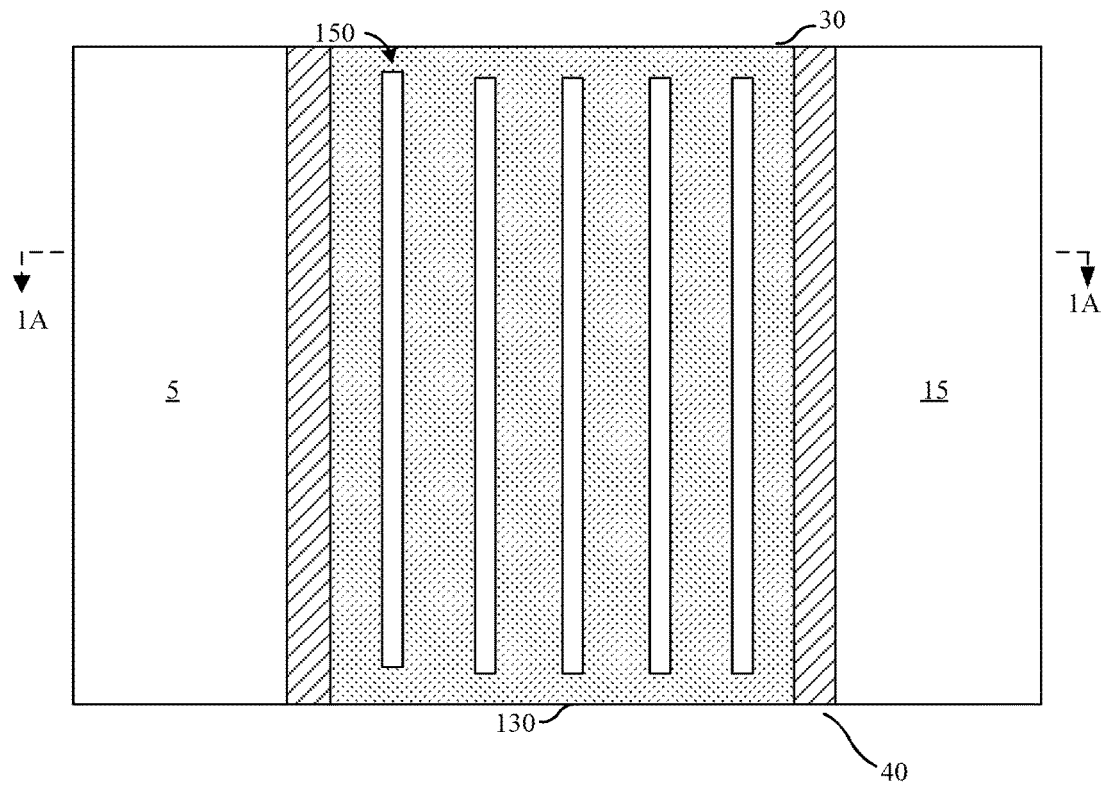
Figure 1D:
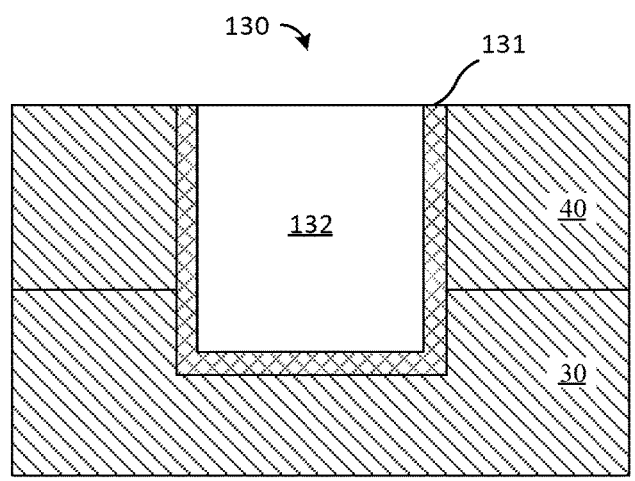

FIG. 1, which includes FIG. 1A-1D, illustrates a semiconductor device in accordance with an embodiment of the present invention, wherein FIG. 1A illustrates a cross-sectional view and FIGS. 1B and 1C illustrate top views, wherein FIG. 1D illustrates a magnified cross-sectional view.

Referring to FIG. 1A, the semiconductor device includes a first contact pad 5 and a second contact pad 15 disposed at a top surface of the workpiece, which may include a substrate 10.

The first contact pad 5 and the second contact pad 15 include a portion of an upper metal layer 120 and a lower metal layer 110.

In one or more embodiments, the first contact pad 5 and the second contact pad 15 are contact pads of a power semiconductor device. For example, the first contact pad 5 may be a gate contact and the second contact pad 15 may be a source contact of a transistor. Alternatively, the first contact pad 5 may be a source contact pad and the second contact pad 15 may be a drain contact pad of a transistor.

In one or more embodiments, the first contact pad 5 may be disposed over a first active region 51 and the second contact pad 15 may be disposed over the second active region 52 in various embodiments. Further, an intermediate region 53 may be disposed between the first active region 51 and the second active region 52. In one or more embodiments, the intermediate regions 53 may be a semiconductor region or an isolation region.

A first insulating layer 20 is disposed over the substrate 10, and a second insulating layer 30 is disposed over the first insulating layer 20. A third insulating layer 40 is disposed over the second insulating layer 30. In various embodiments, more or less number of insulating layers may be disposed over the substrate 10. Further, each of the first insulating layer 20, the second insulating layer 30, and the third insulating layer 40 may include multiple layers.

In various embodiments, the region between the first contact pad 5 and the second contact pad 15 above the intermediate regions 53 includes one or more metal features 130. As further illustrated in FIG. 1A, the metal features 130 extend into the third insulating layer 40. In one or more embodiments, the metal features 130 extend into one or more of the first, second, third insulating layers 20, 30 and 40.

In one or more embodiments, the metal features 130 are elongated in one direction but narrow in another perpendicular direction, forming a series of narrow stripes. In some embodiments, these stripes may be formed also along perpendicular directions such that the stripes oriented along the perpendicular directions intersect to form a mesh.

FIG. 1B illustrates a top view of the metal pattern 150 formed by the metal features 130. As illustrated in FIG. 1B, the metal pattern 150 can enhance the thermal conduction of the region between the first contact pad 5 and the second contact pad 15.

The presence of the mesh comprising the metal features 130 may improve the thermal conductivity of this region between the first and the second contact pads 5 and 15. Advantageously, the improved thermal conductivity may be leveraged, for example, to enable an embedded temperature sensor to improve the connection or coupling with an active device region and/or to provide better thermal connection to a heat sink.

However in some embodiments, the stripes formed by the metal features 130 may be isolated from each other, for example, to minimize the chance of an electrical short across the first contact pad 5 to the second contact pad 15.

In various embodiments, the metal features 130 are made of the same material as the lower metal layer 110. In other words, as described in various embodiments below, the metal features 130 are formed at the same process step as the lower metal layer 110.

FIG. 1C illustrates an alternative embodiment in which the metal features 130 are isolated from each other minimizing the chance of a short between the first contact pad 5 and the second contact 15. In this embodiment, all the metal features 130 are oriented along a single direction.

As illustrated in the magnified cross-sectional view of FIG. 1D, the metal features 130 may include more than one metal layers. For example, the metal features 130 may include a metal liner 131 and a fill material 132. For example, the metal liner 131 may be a stack comprising layers of titanium, titanium nitride while the fill material 132 may be tungsten in one embodiment.

FIG. 2, which includes FIG. 2A-2I, illustrates a cross-sectional view of a semiconductor device during various stages of fabrication in accordance with an embodiment of the present invention.

Figure 2A:
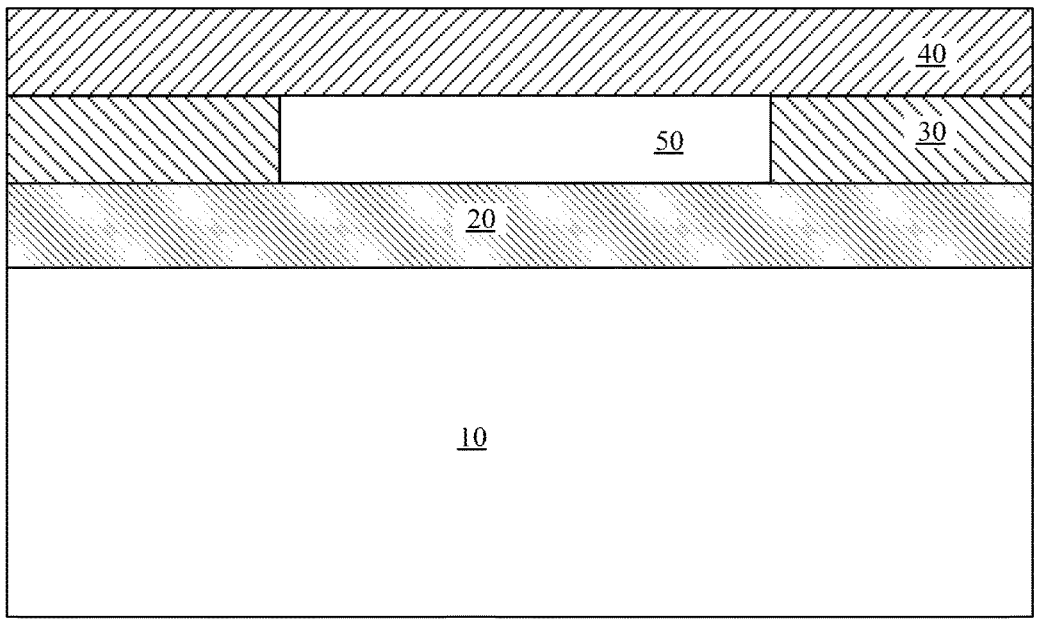
FIG. 2A-2I, illustrates a cross-sectional view of a semiconductor device during various stages of fabrication in accordance with an embodiment of the present invention.

Referring to FIG. 2A, a semiconductor device at this stage of fabrication includes a substrate 10 comprising device regions, for example, doped regions. The substrate 10 may be a wafer and may include epitaxial layers in various embodiments. In one or more embodiments, the substrate 10 may be a bulk silicon wafer or a silicon-on-insulator wafer. In some embodiments, the substrate 10 may be an III-V substrate with elements from Group III and Group V, or the substrate 10 may be an II-VI substrate with elements from Group II and Group VI. In one or more embodiments, the substrate 10 may be a silicon-on-sapphire (SOS) substrate. In one or more embodiments, the substrate 10 may be a germanium-on-insulator (GeOI) substrate. In one or more embodiments, the substrate 10 may include one or more semiconductor materials such as silicon, silicon germanium, silicon carbon, germanium, gallium arsenide, indium arsenide, indium arsenide, gallium nitride, indium gallium arsenide, or indium antimonide.

At this stage of processing, the substrate 10 may have completed front stage processing. For example, the device regions and front side metallization layers may be formed at the top surface of the substrate 10. The substrate 10 may include a plurality of dies, which may comprise different type of dies including integrated circuits or discrete devices. In one or more embodiments, the plurality of dies in the substrate 10 may comprise logic chips, memory chips, analog chips, mixed signal chips, and combinations thereof such as system on chip. The plurality of dies in the substrate 10 may comprise various types of active and passive devices such as diodes, transistors, thyristors, capacitors, inductors, resistors, optoelectronic devices, sensors, microelectromechanical systems, and others. In one embodiment, the substrate 10 comprises a plurality of dies, each die being a discrete device such as a single transistor. Examples of discrete devices include power devices, vertical devices (current flowing from top to bottom), and others.

A first insulating layer 20 is formed over the substrate 10. In various embodiments, the first insulating layer 20 may comprise a dielectric material such as an inter-level dielectric (ILD) layer. However, in some embodiments, the first insulating layer 20 may be a gate dielectric layer of a transistor, a tunnel dielectric layer of a flash or floating gate transistor, or a field oxide depending on the implementation and may depend on the type of device being formed.

The first insulating layer 20 may comprise an oxide in one embodiment. In various embodiments, the first insulating layer 20 may comprise insulating materials typically used in semiconductor manufacturing for inter-level dielectric layers, such as SiO2, tetra ethyl oxysilane (TEOS), fluorinated TEOS (FTEOS), doped glass (borophosphosilicate glass (BPSG), phosphosilicate glass (PSG), borosilicate glass (BSG)), organo silicate glass (OSG), fluorinated silicate glass (FSG), spin-on glass (SOG), SiN, SiON, or low-k insulating materials such as SiCOH. The first insulating layer 20 may comprise a thickness of about 500 nm or less in various embodiments. In one embodiment, the first insulating layer 20 comprises a thickness of about 5 nm to about 50 nm. In another embodiment, the first insulating layer 20 comprises a thickness of about 10 nm to about 100 nm. In another embodiment, the first insulating layer 20 comprises a thickness of about 50 nm to about 200 nm. In one embodiment, the first insulating layer 20 comprises a thickness of about 100 nm to about 300 nm.

The first insulating layer 20 may be grown (e.g., by oxidation, nitridation, combination thereof, etc.), deposited, for example, using chemical vapor deposition (CVD), atomic layer deposition (ALD), metal organic chemical vapor deposition (MOCVD), physical vapor deposition (PVD), or jet vapor deposition (JVD), as examples.

A first conductive line 50 is formed over the first insulating layer 20. The first conductive line 50 may be patterned using lithography. After patterning the first conductive line 50, an inter level dielectric may be formed over the first conductive line 50. In an alternate embodiment, a second insulating layer 30 is deposited and planarized after forming the first insulating layer 20. Next, the third insulating layer 40 is deposited over the second insulating layer 30. In various embodiments, the second insulating layer 30 and the third insulating layer 40 may be deposited using similar techniques as described above with respect to the first insulating layers 20.

Figure 2B:
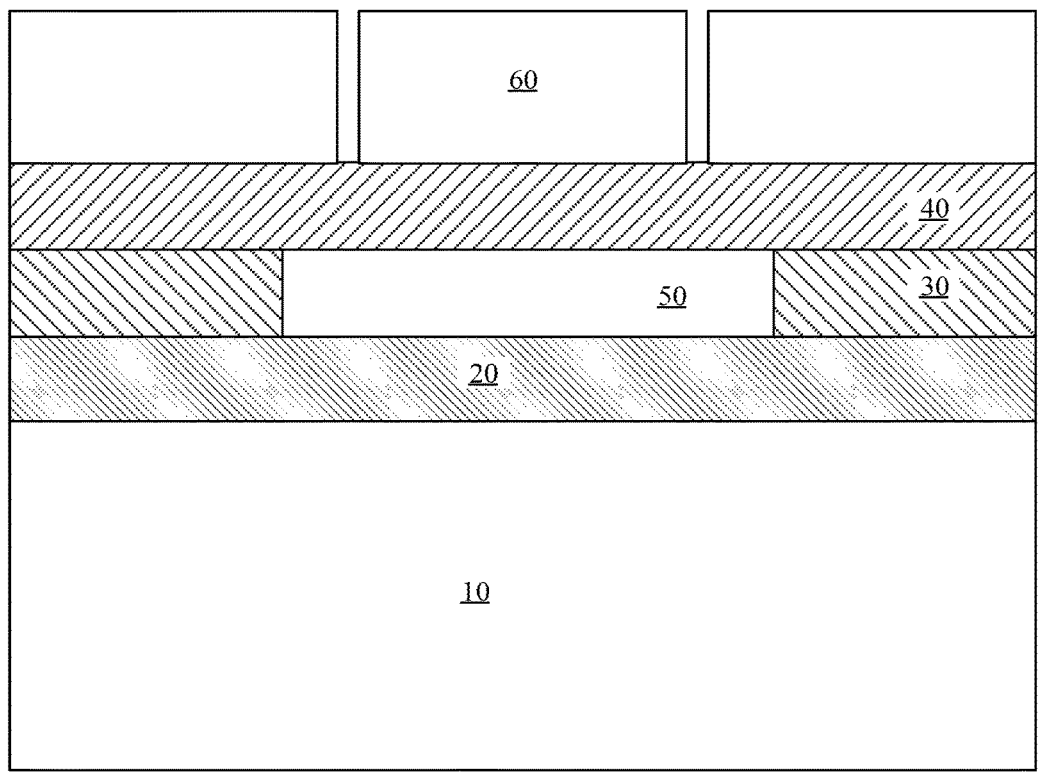

As next illustrated in FIG. 2B, a first resist layer 60 is formed over the substrate 10 and patterned. The first resist 60 may comprise a single resist layer, or a multi-layer resist such as a bi-layer resist layer or a tri-layer resist. In various embodiments, the first resist layer 60 may be a photo resist and may be patterned using conventional photolithographic techniques. Alternatively, the first resist layer 60 may comprise a hard mask material such as silicon oxide or silicon nitride which is structured using a photo resist layer (not shown).

As illustrated in FIG. 2B, the first resist layer 60 is structured in regions at which metal features are going to be formed (as will be described further below).

Figure 2C:
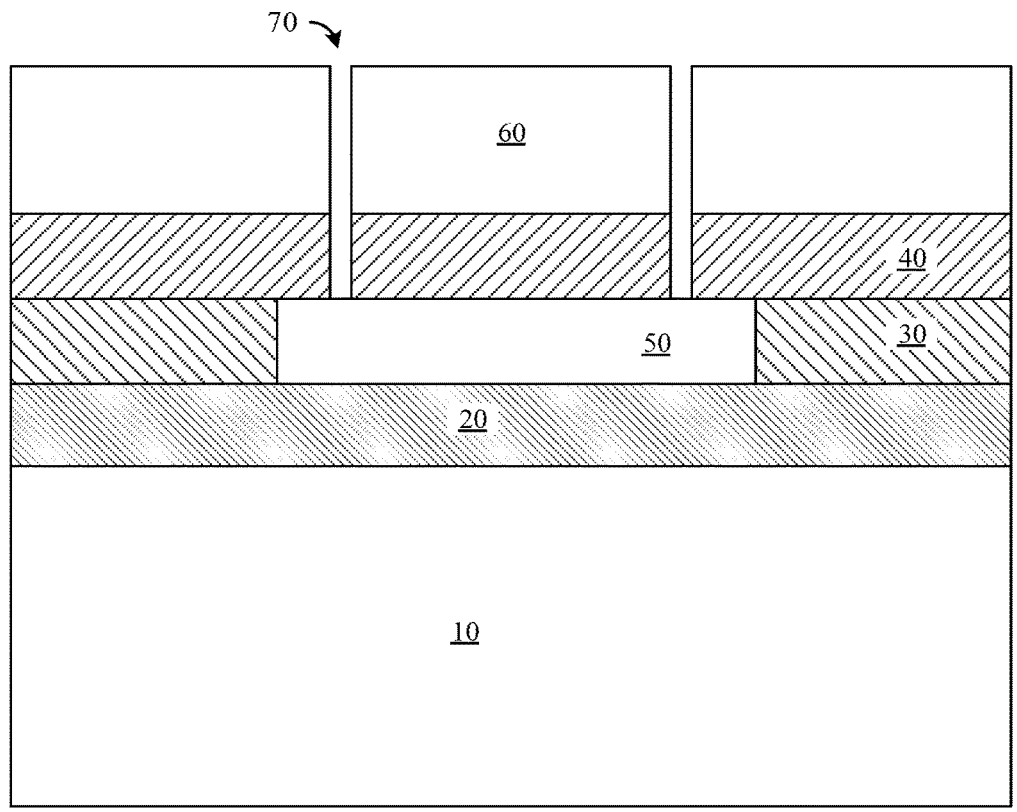

FIG. 2C illustrates a first trench 70 formed in the third insulating layer 40. The first trench 70 is patterned using the structured first resist layer 60 as an etch mask. In various embodiments, the first trench 70 may be formed using an anisotropic etch process such as a reactive ion etch process.

Figure 2D:
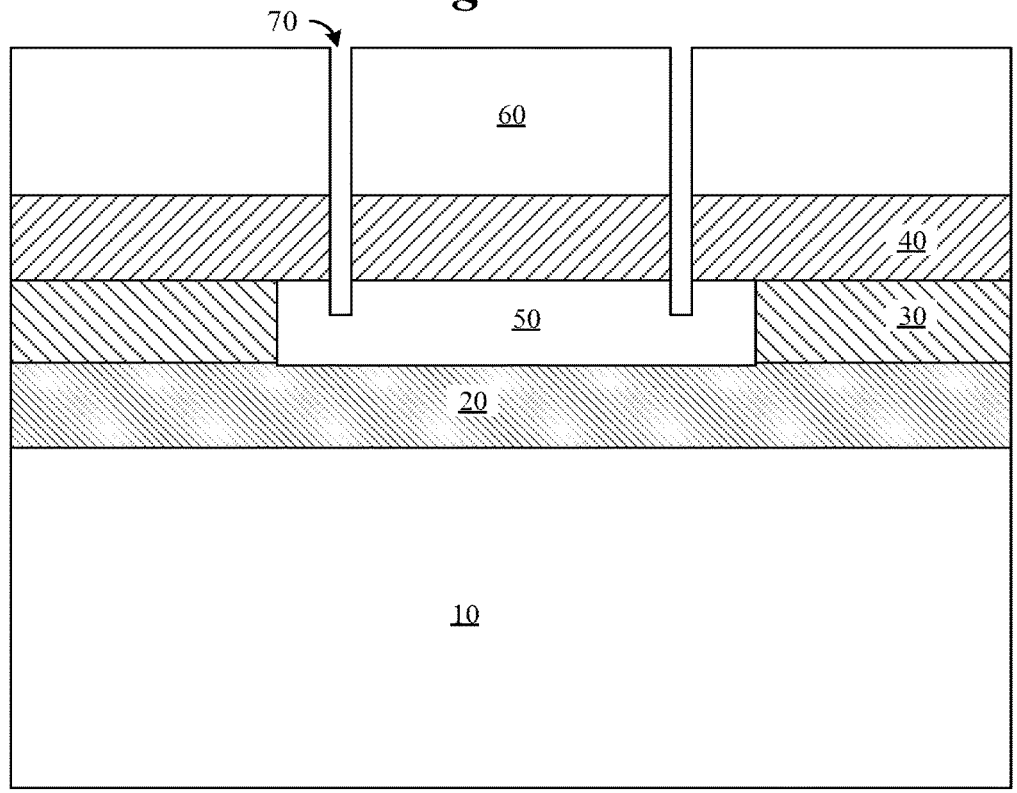

As next illustrated in FIG. 2D, the first trench 70 may be extended into the underlying layers. For example, in one embodiment, the underlying first conductive line 50 is etched. However, in various embodiments, the first trench 70 does not extend through the first conductive line 50. Rather, the first trench 70 partially extends into the first conductive line 50.

Figure 2E:
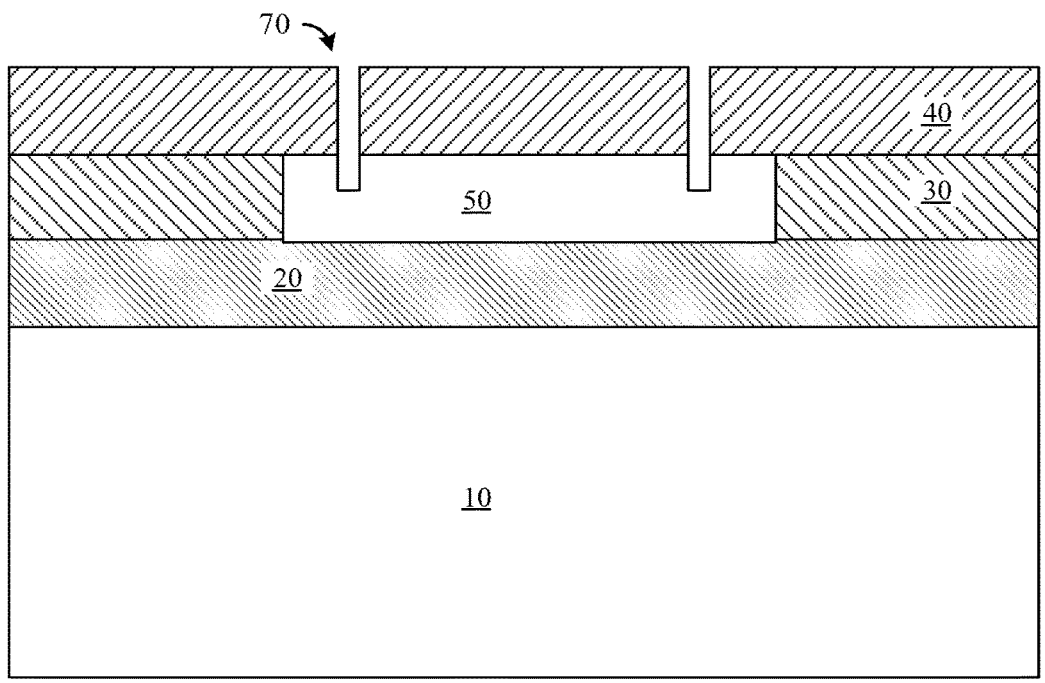

Referring next to FIG. 2E, any remaining first resist layer 60 is removed. The first resist layer 60 may be removed using a etch process such as a wet etch process in one or more embodiments.

Figure 2F:
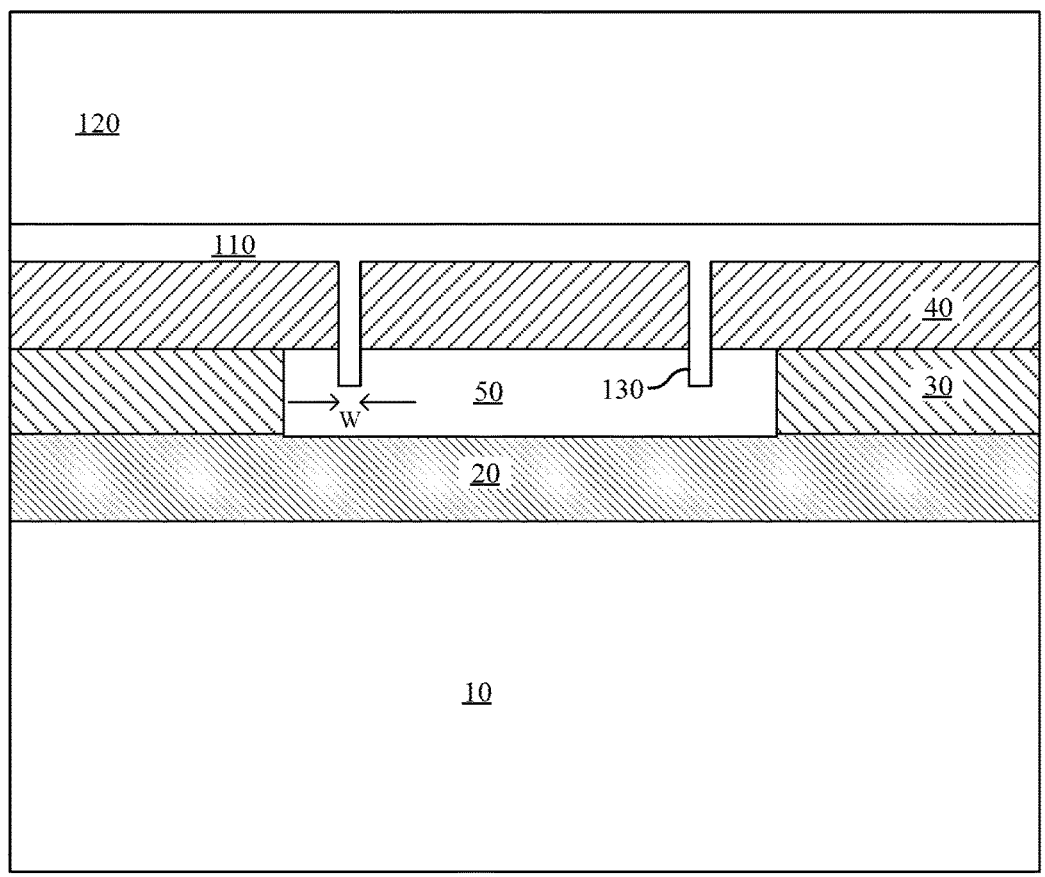

As next illustrated in FIG. 2F, a lower metal layer 110 is formed over the substrate 10 followed by an upper metal layer 120. As further illustrated, the lower metal layer 110 at least partially fills the first trench 70 to form metal features 130. In various embodiments, the lower metal layer 110 comprises a metal deposition process that is configured to fill the narrow aspect ratio trench such as the first trench 70. In one or more embodiments, the lower metal layer 110 comprises tungsten, titanium, tantalum, titanium nitride, tantalum nitride, tungsten nitride, tungsten carbide, and other suitable barrier materials.

In various embodiments, the lower metal layer 110 may comprise multiple layers. For example, the lower metal layer 110 may include an adhesion layer, a barrier layer, and a seed layer. In various embodiments, the lower metal layer 110 is a barrier material that is configured to prevent diffusion of elements such as metal atoms from the lower metal layers as well as to prevent diffusion of atoms from the upper metal layer 120.

In various embodiments, the lower metal layer 110 may be deposited using a deposition technique such as sputtering, physical vapor deposition, chemical vapor deposition, atomic layer deposition, and other such techniques. In various embodiments, the lower metal layer 110 has a thickness of about 10 nm to about 1 μm, and about 500 nm in one embodiment.

In various embodiments, the metal thickness of the deposited lower metal layer 110 is at least half of the width W of the first trench 70. In one or more embodiments, the thickness of the deposited lower metal layer 110 is about the same as the width W of the first trench 70.

After depositing the lower metal layer 110, an upper metal layer 120 is formed. The upper metal layer 120 is thicker than the lower metal layer 110 and may be about 10× to about 20× the thickness of the lower metal layer 110 in various embodiments. Accordingly, the upper metal layer 120 may not be amenable to fill the narrow dimensions of the first trench 70.

In various embodiments, the upper metal layer 120 may comprise aluminum, copper, titanium, aluminum alloys such as AlSi, AlCu, AlSiCu, and others. In some embodiments, the upper metal layer 120 may include a solderable layer such as Sn, Zn, In, Ga, Ge, Pb or alloys of these including other alloying elements like AuSn, CuSnAg, SnAg, or any suitable metal, metal alloy or solder material. In some embodiments, the upper metal layer 120 may include a protective metal such as silver, gold, platinum, palladium or alloys of these including other alloying elements or any element, alloy or compound, which, e.g., may be appropriate to prevent oxidation of the underlying metal of the upper metal layer 120.

Figure 2G:
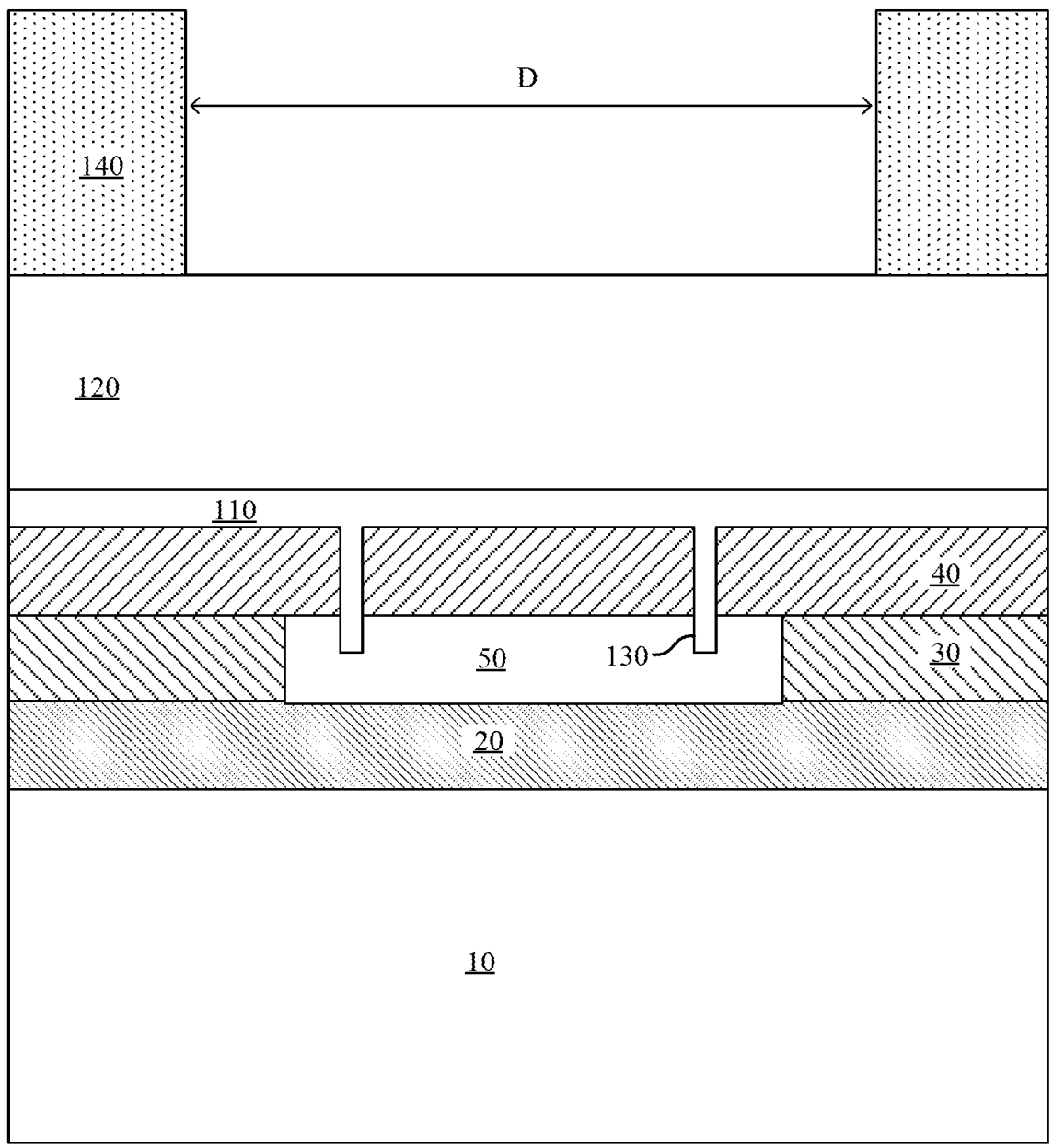

Referring next to FIG. 2G, a second resist layer 140 is formed over the upper metal layer 120 and structured. The second resist layer 140 may comprise a photo resist material in one embodiment and may be structured using lithography techniques. After the patterning of the second resist layer 140, a top surface of the upper metal layer 120 is exposed.

As an illustration, the distance D may be the minimum distance in the design rule for patterning the upper metal layer 120 for the process technology used to fabricate the semiconductor device.

Figure 2H:
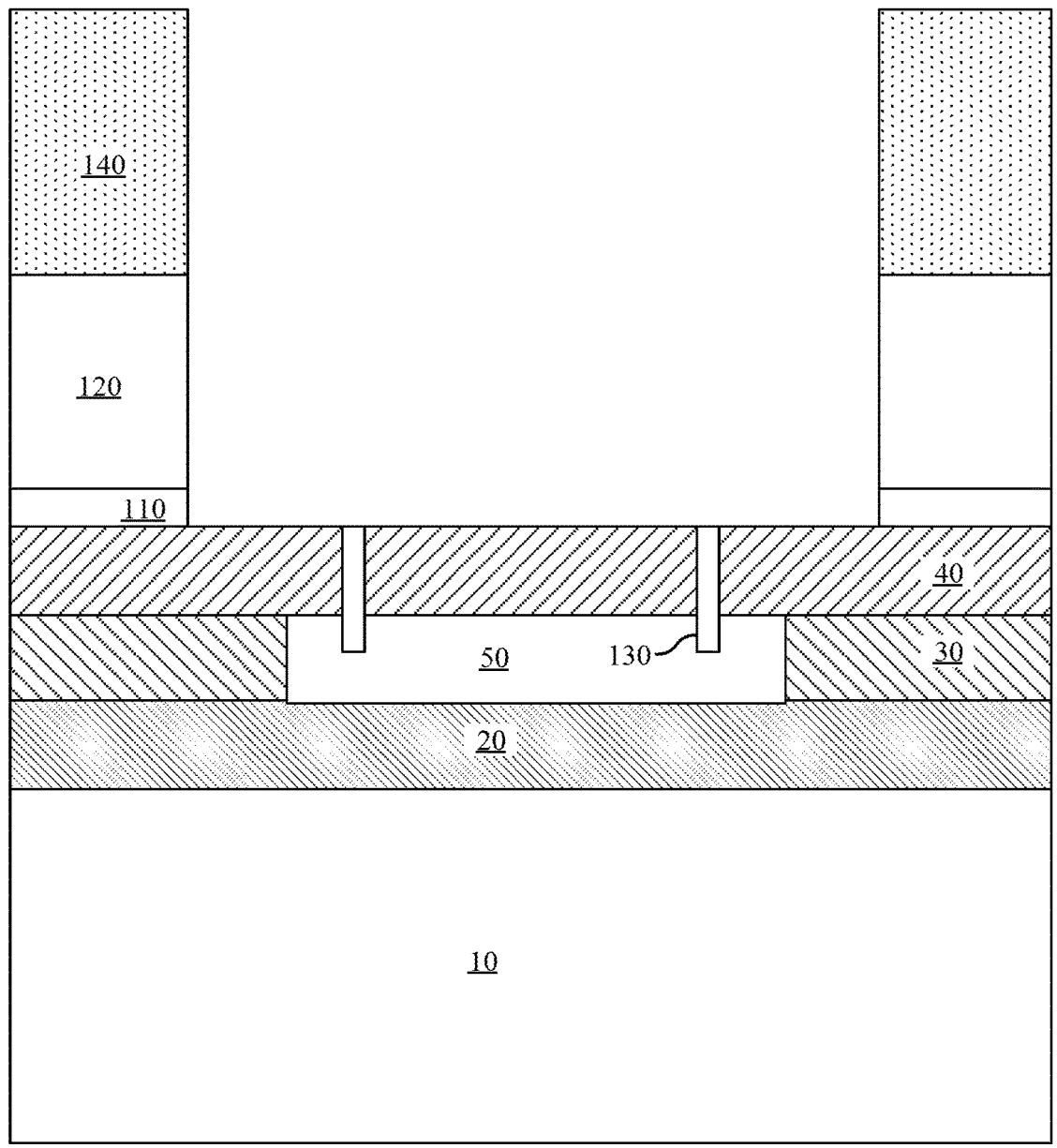

As next illustrated in FIG. 2H, using the structured second resist layer 140, the upper metal layer 120 and the lower metal layer 110 are patterned. However, the lower metal layer 110 is not removed from the first trench 70 thus forming a metal feature 130 within the third insulating layer 40 and at least a portion of the first conductive line 50. This is because the etching process used to remove the lower metal layer 110 may be stopped before all of the lower metal is removed from the first trench 70. This may be implemented by different methods. For example, in various embodiments, the etching may be stopped when an end point is detected or alternatively by using a timed etch.

Thus, in one or more embodiments, metal features 130 are formed within the region between the two portions of the upper metal layer 120.

Figure 2I:
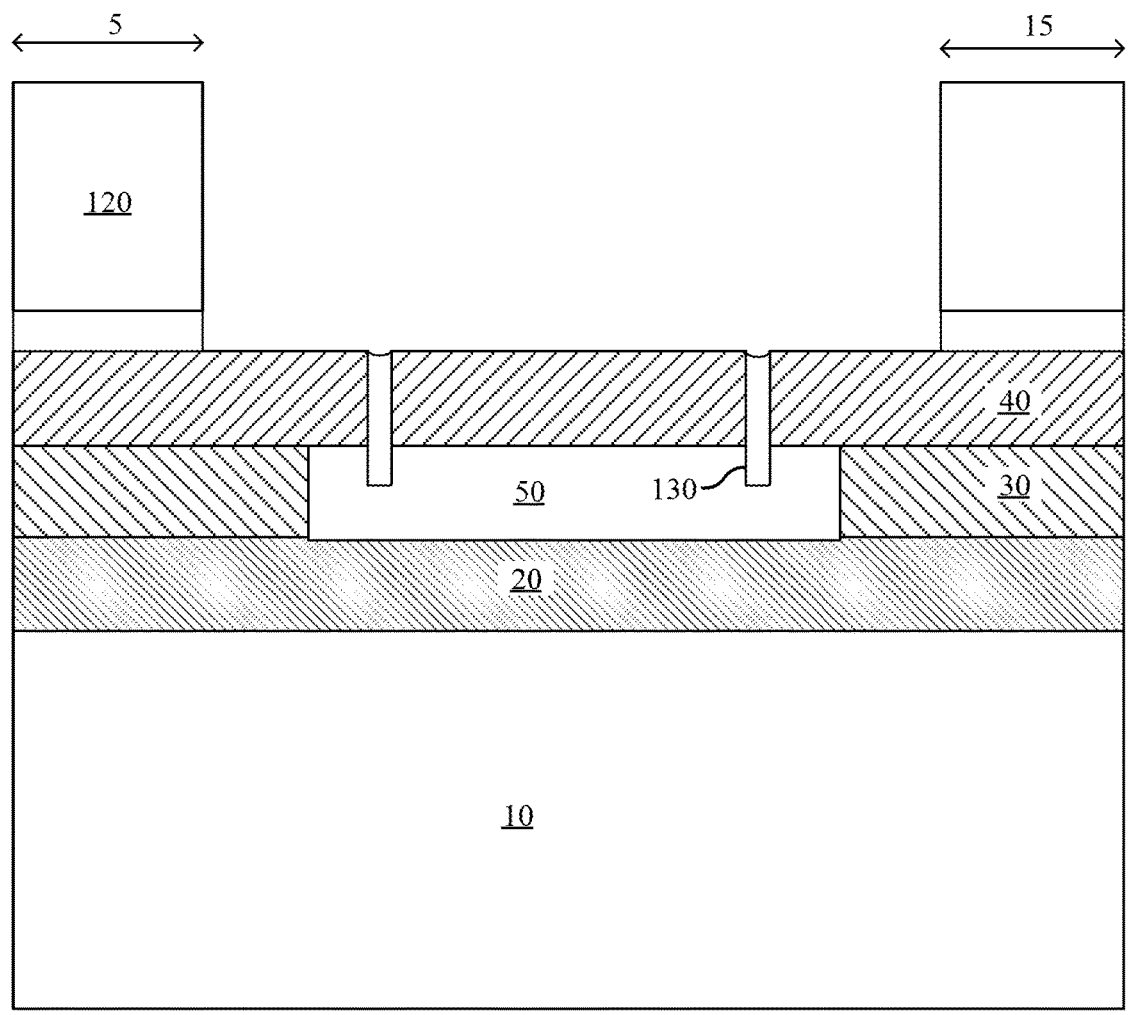

As next illustrated in FIG. 2I, the second resist layer 140 is removed, for example, using a wet etch process. Accordingly, metal features 130 remain and may be used to improve the thermal conductivity of the region between the first contact pad 5 and the second contact pad 15.

In a specific embodiment, the method described above comprises forming a poly silicon layer (e.g., first conductive line 50 in FIG. 2A) and an insulating layer (e.g., third insulating layer 40) above the poly silicon layer. Small openings (e.g., trench 70 in FIG. 2C) are formed in the insulating layer and the poly silicon layer. Alternatively, in another embodiment, the openings in the poly silicon layer may be formed before the formation of the insulating layer. A metal layer stack (e.g., lower metal layer 110 and upper metal layer 120 in FIG. 2F) is formed overlying the poly silicon openings. The metal stack includes at least a first thin layer (e.g., lower metal layer 110) and a second thicker layer (e.g., upper metal layer 120), where the first thin layer has a thickness of at least half of the width of the small poly silicon openings. The metal layer may fill the small openings completely, being deposited on the sidewalls, and therefore may have a thickness equal to at least half of the width of the small openings. In one embodiment, a compromise between feature size and process yield may be obtained when the lower metal thickness is about the same size as the width of the small opening. A resist pattern (e.g., second resist layer 140 in FIG. 2G) is formed on the thick metal layer such that a portion of the thick metal layer above the poly silicon openings may be exposed to a subsequent etch process. The exposed thick metal layer is removed entirely from the region in which the poly silicon openings were formed. The underlying thin metal layer is exposed and is etched. However, the etching of the thin metal layer is controlled such that the thin metal remains in the poly silicon openings but is removed from other exposed areas (FIG. 2H).

Figure 3A:
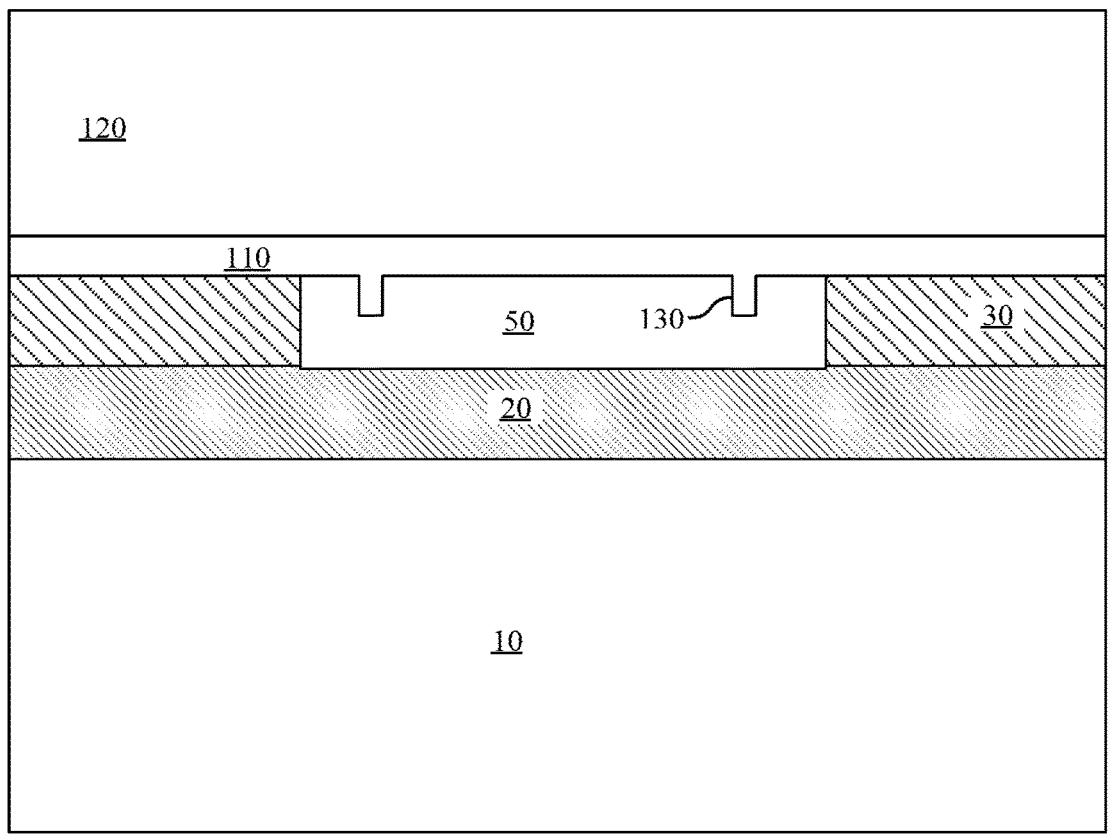
FIGS. 3A and 3B, illustrates a cross-sectional view of a semiconductor device during various stages of fabrication in accordance with an alternative embodiment of the present invention.
Figure 3B:
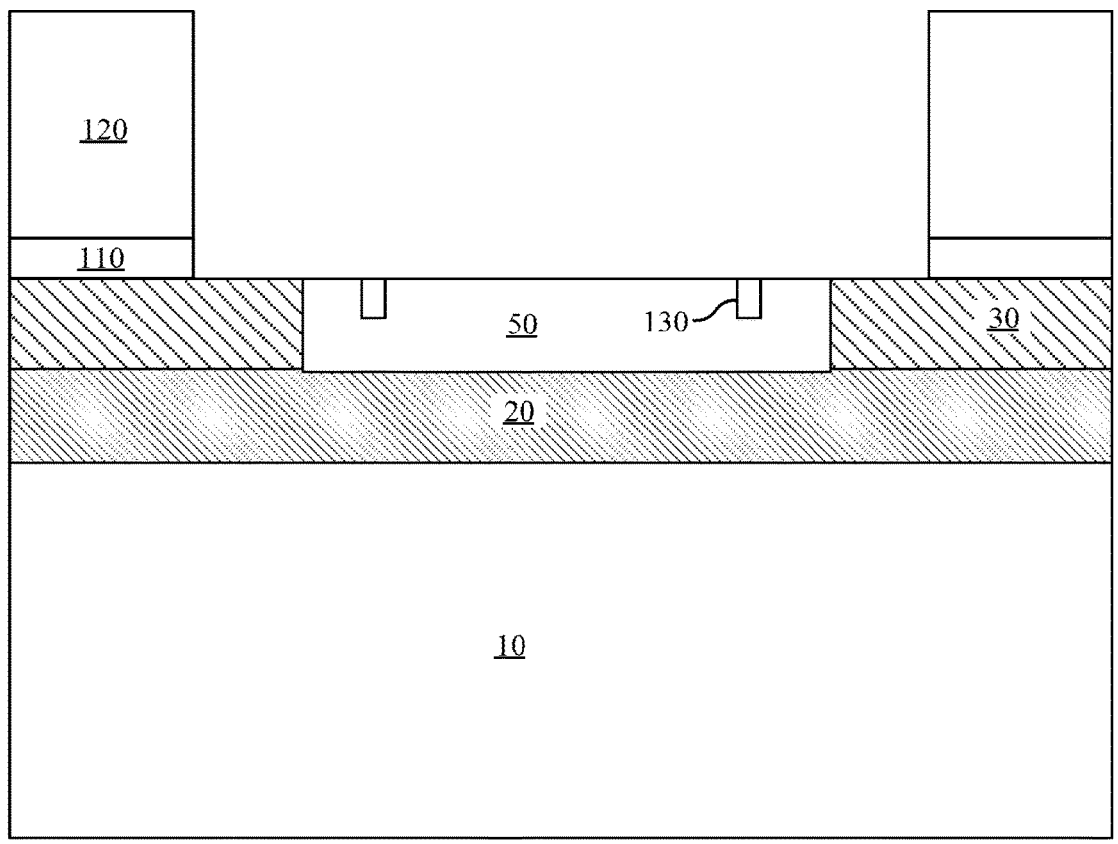

FIG. 3, which includes FIGS. 3A and 3B, illustrates a cross-sectional view of a semiconductor device during various stages of fabrication in accordance with an alternative embodiment of the present invention.

Referring to FIG. 3A, in an alternative embodiment, the lower metal layer 110 may be formed directly on the second insulating layer 30. Accordingly, the metal features are formed directly only in the first conductive line 50.

Subsequent processing may follow as in previous embodiments to form a first contact pad 5 and a second contact pad 15.

Figure 4A:
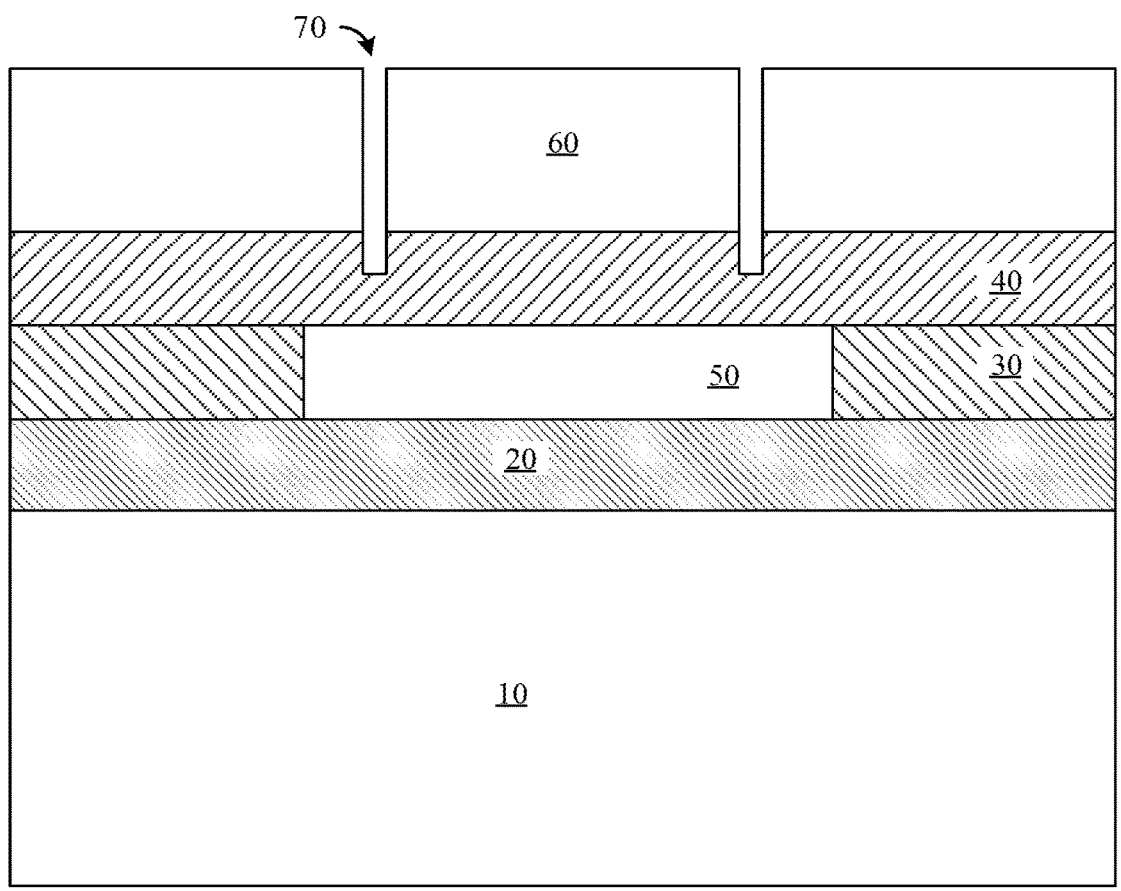
FIGS. 4A and 4B, illustrates a cross-sectional view of a semiconductor device during various stages of fabrication in alternative accordance with an embodiment of the present invention.
Figure 4B:
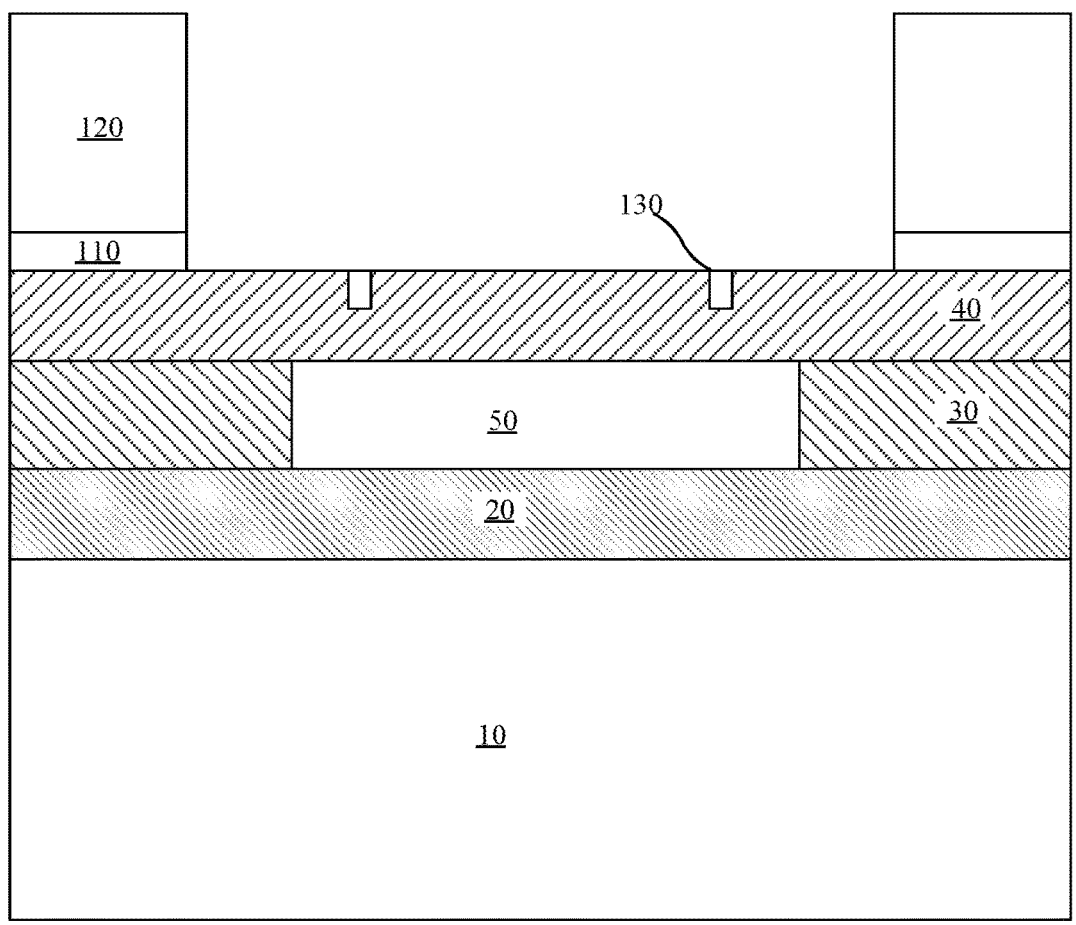

FIG. 4, which includes FIGS. 4A and 4B, illustrates a cross-sectional view of a semiconductor device during various stages of fabrication in alternative accordance with an embodiment of the present invention.

In this embodiment, the metal features 130 are formed only within the third insulating layer 40. For example, as illustrated in FIG. 4A, the first trench 70 is stopped before reaching the other side of the third insulating layer 40. Subsequent processing follows as illustrated in FIG. 4B. In this embodiment the first conductive line 50 may be present below the third insulating layer 40 or may be omitted.

FIG. 5, which includes FIG. 5A-5E, illustrates a cross-sectional view of a semiconductor device during various stages of fabrication in accordance with an alternative embodiment of the present invention.

FIG. 5 illustrates a different embodiment for forming contacts between two conductive layers. Referring first to FIG. 5A, conductive regions 220 are formed in or above the substrate 10. In some embodiments, the conductive regions 220 may be formed over an embedded insulating layer 210, for example, as part of a semiconductor on insulator substrate.

The conductive regions 220 may comprise doped semiconductor regions, doped polysilicon regions, and metallic regions in various embodiments. In some embodiments, different portions of the conductive regions 220 may be isolated using isolation regions 225.

Figure 5A:
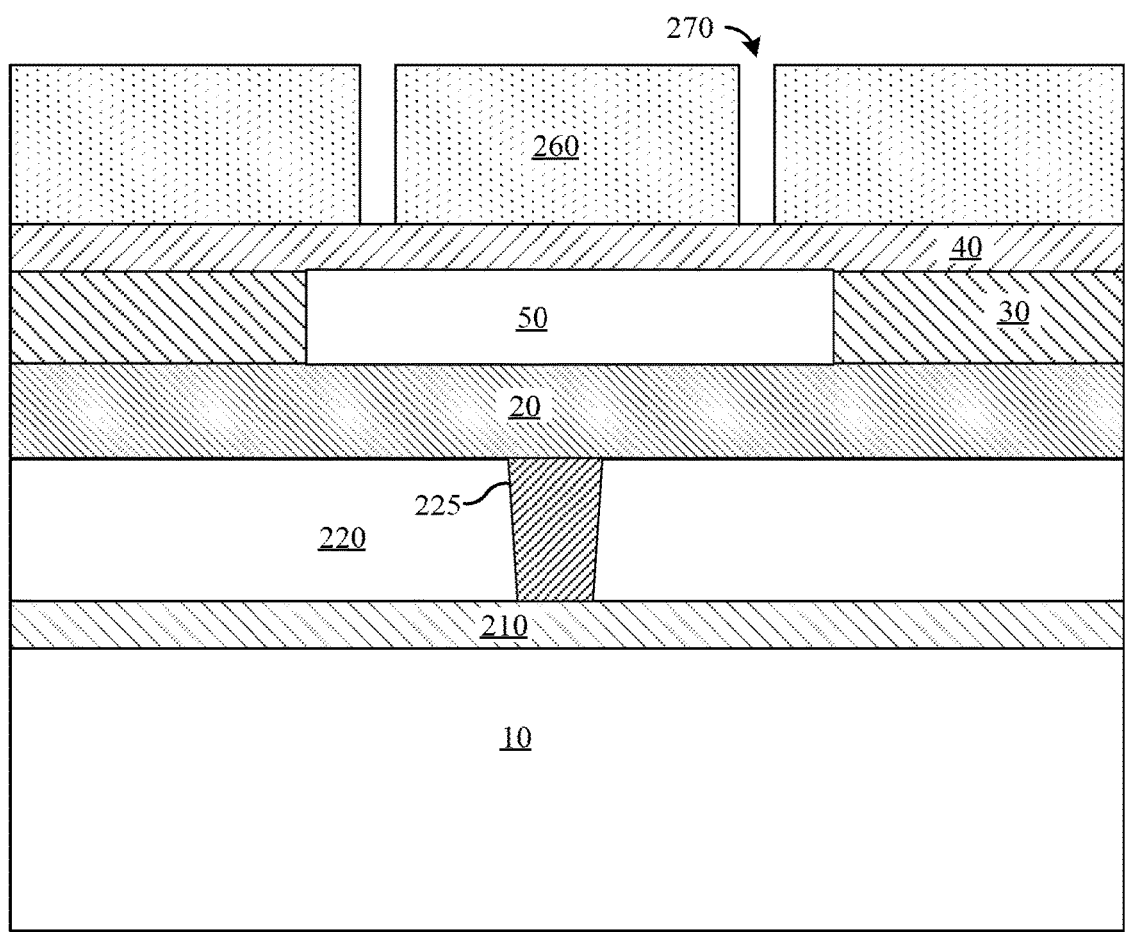
FIG. 5A-5E, illustrates a cross-sectional view of a semiconductor device during various stages of fabrication in accordance with an alternative embodiment of the present invention.

Referring to FIG. 5A, a first conductive line 50 is formed over the conductive regions 220 and a first insulating layer 20. The first insulating layer 20 may be a gate dielectric layer or a tunnel dielectric layer in some embodiments. As in prior embodiments, the first conductive line 50 may be formed within a second insulating layer 30. A third insulating layer 40 may be formed over the first conductive line 50. A first photo resist layer 260 is formed over the third insulating layer 40.

Referring to FIG. 5A, a first opening 270 is formed within the first photo resist layer 260. Unlike the prior embodiments, in this embodiment, the first opening 270 may be a contact hole (e.g., circular, elliptical) and may not be a trench or strip.

Figure 5B:
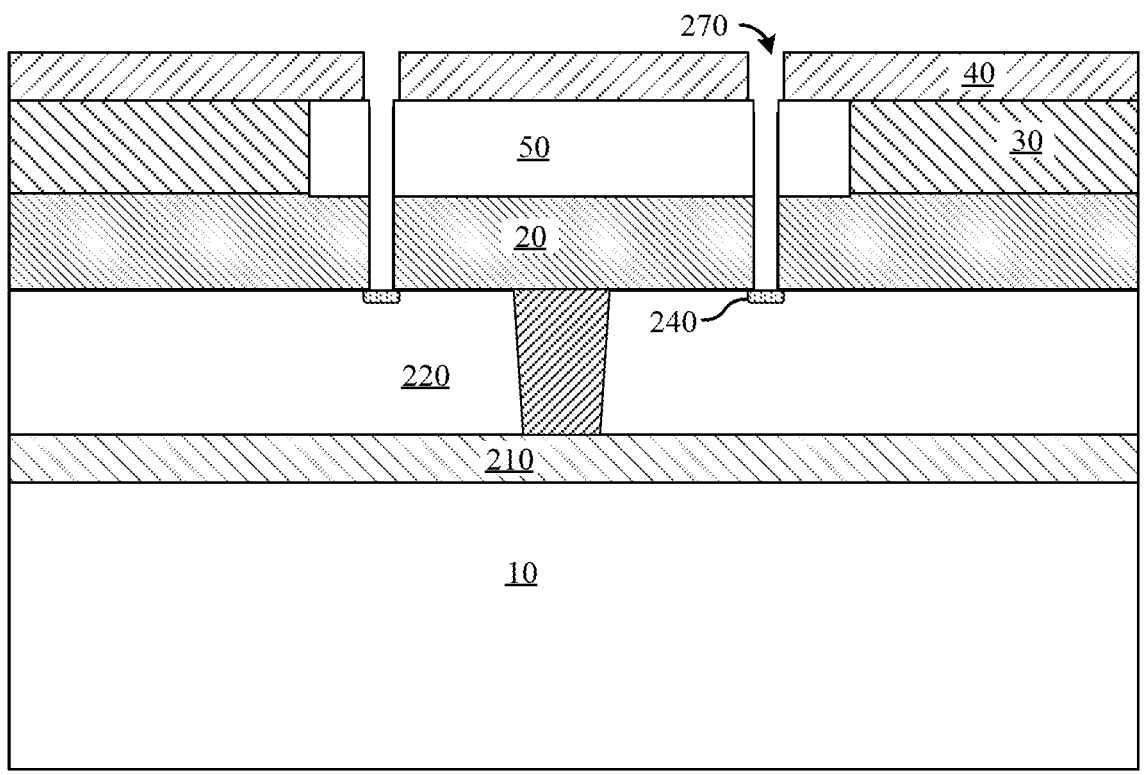

As next illustrated in FIG. 5B, the first opening 270 extends from the third insulating layer 40, the first conductive line 50, and the first insulating layer 20 to the conductive regions 220. Thus, the first opening 270 is formed through the first conductive line 50 to expose contact regions 240 at the conductive regions 220.

After forming the first opening 270, the contact regions 240 may be doped to improve (reduce) the contact resistance. In one embodiment, a vertical implant may be performed towards the substrate 10. The implant may be blocked by the layers adjacent the first opening 270. Thus, only the portion of the conductive regions 220 exposed by the first opening 270 is implanted. In one or more embodiments, the contact regions 240 are implanted with a same type of dopant as the doping of the conductive regions 220. Alternatively, in another embodiment, the contact regions 240 have the opposite doping type as the conductive regions 220 so as to form a diode. For example, if the conductive regions 220 comprise p-type doping, a p-type dopant is implanted. After a subsequent annealing process, the doped contact regions 240 are formed. In some embodiments, the doped contact regions 240 may also be formed using other doping techniques such as plasma doping, solid state diffusion doping, and others.

Figure 5C:
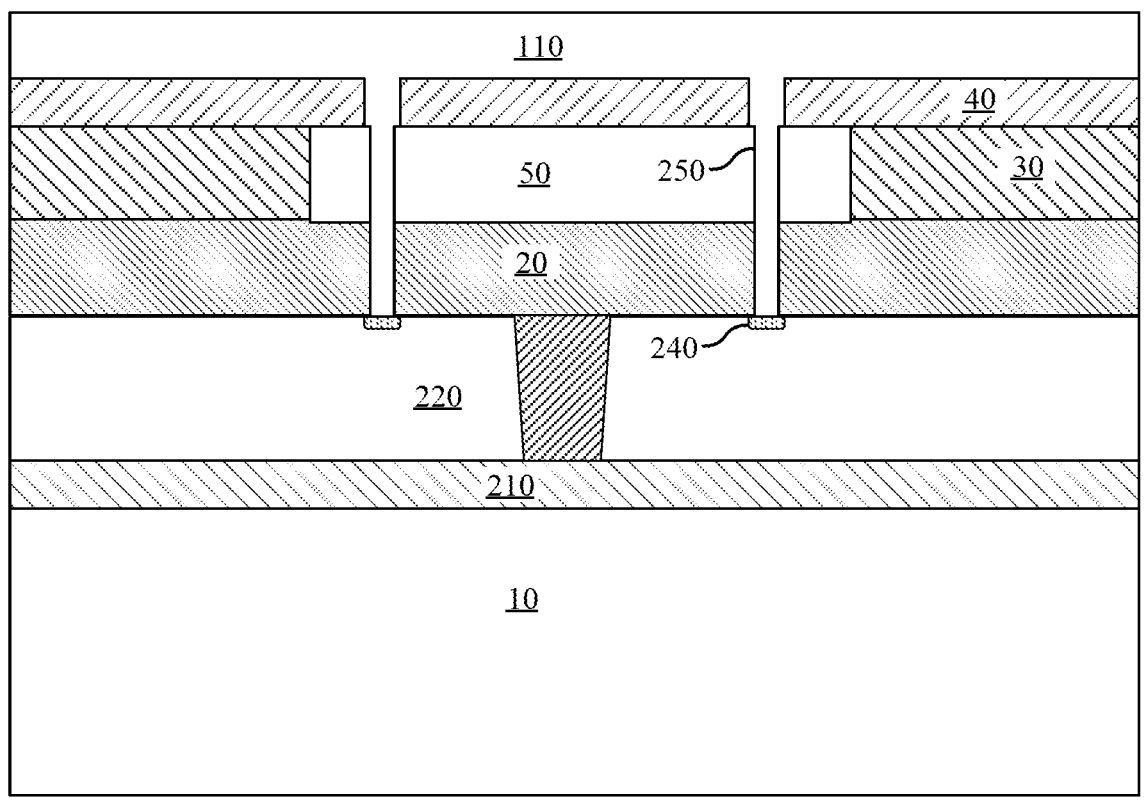

As next illustrated in FIG. 5C, the lower metal layer 110 is deposited over the substrate 10. The lower metal layer 110 fills at least partially into the first opening 270 in one or more embodiments. In one embodiment lower metal layer 110 completely fills the first opening and an overfill layer is formed above the third insulating layer 40. In various embodiments, the lower metal layer 110 may comprise multiple layers such as an adhesion layer, a barrier layer, and a seed layer. See also FIG. 1D showing the metal features 130 having a metal liner 131 and fill material 132 as an example.

Figure 5D:
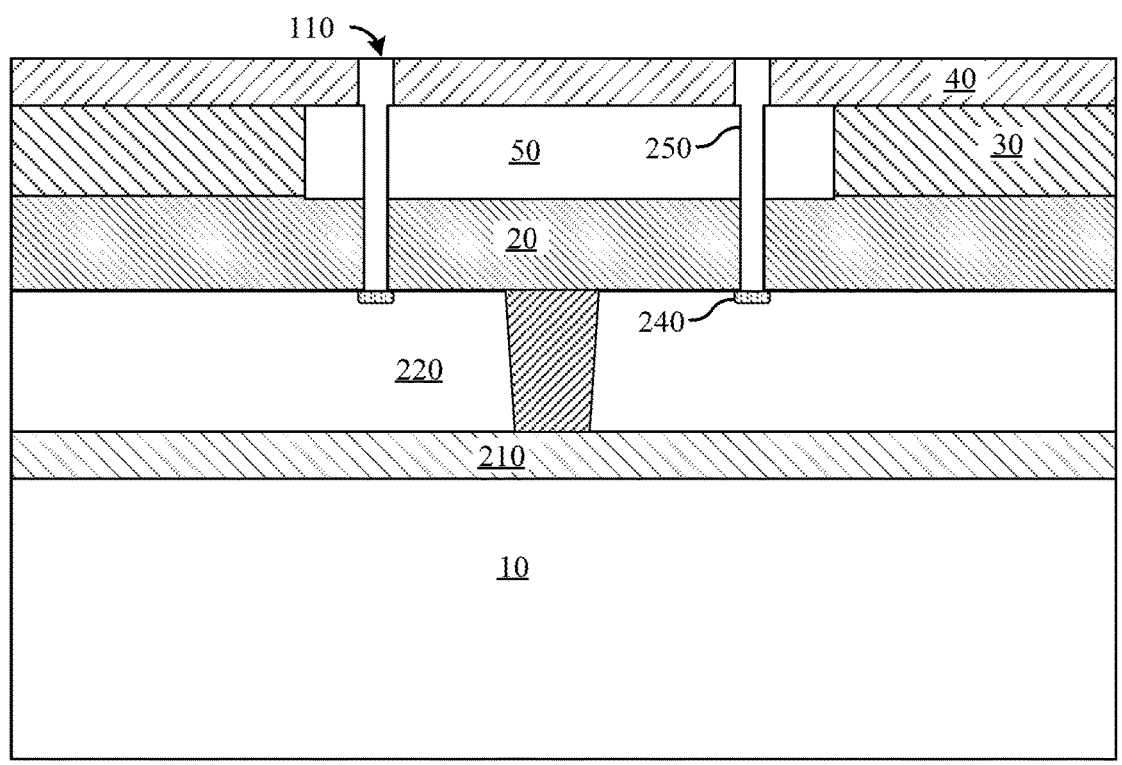

Referring next to FIG. 5D, in one or more embodiments, the lower metal layer 110 is planarized, for example, to remove the overfill layer. Thus, in one or more embodiments, a plurality of contacts 250 is formed coupling the first conductive line 50 with the conductive regions 220.

Figure 5E:
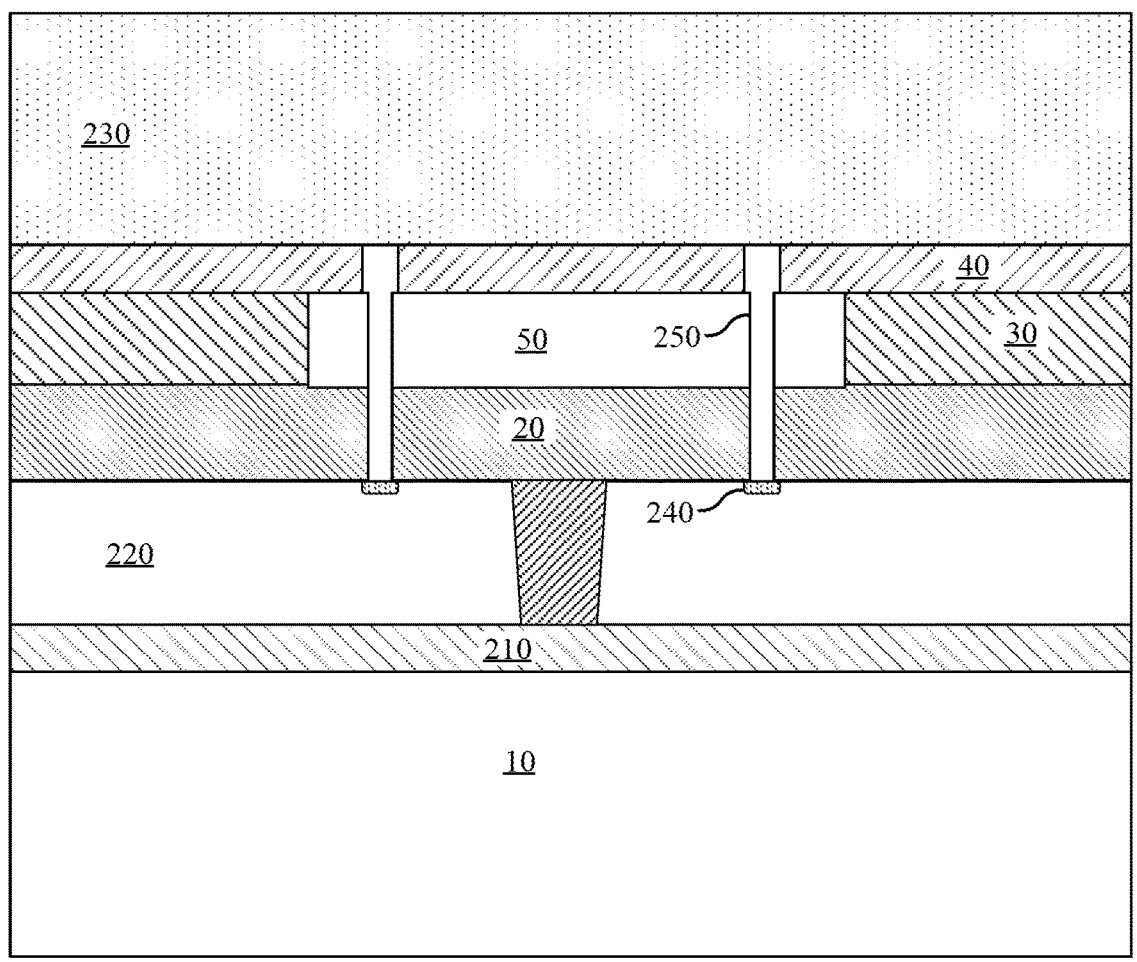

As next illustrated in FIG. 5E, a protection layer 230 may be formed above the third insulating layer 40. Alternatively, an upper metal layer may be formed over the third insulating layer 40 before forming the protection layer 230 such that the same contacts 250 couple the upper metal layer, the first conductive line 50, and the conductive regions 220. In various embodiments, the protection layer 230 may comprise an oxide, nitride, imide, and other suitable materials.

Figure 6B:
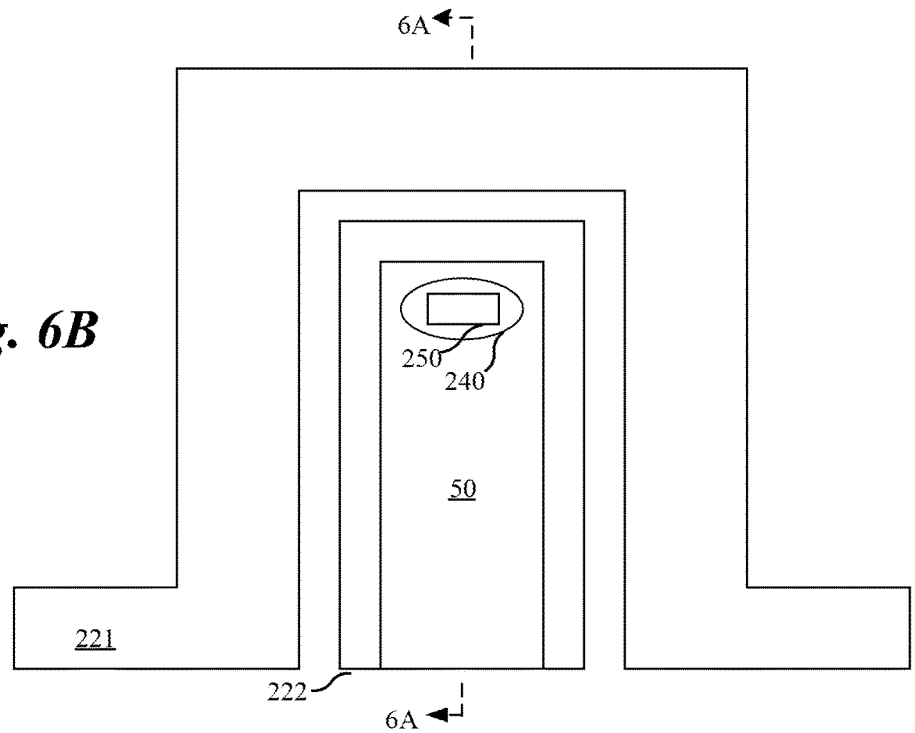
FIGS. 6A and 6B, illustrates a semiconductor device having a poly contact in accordance with an embodiment of the present invention.
Figure 6A:
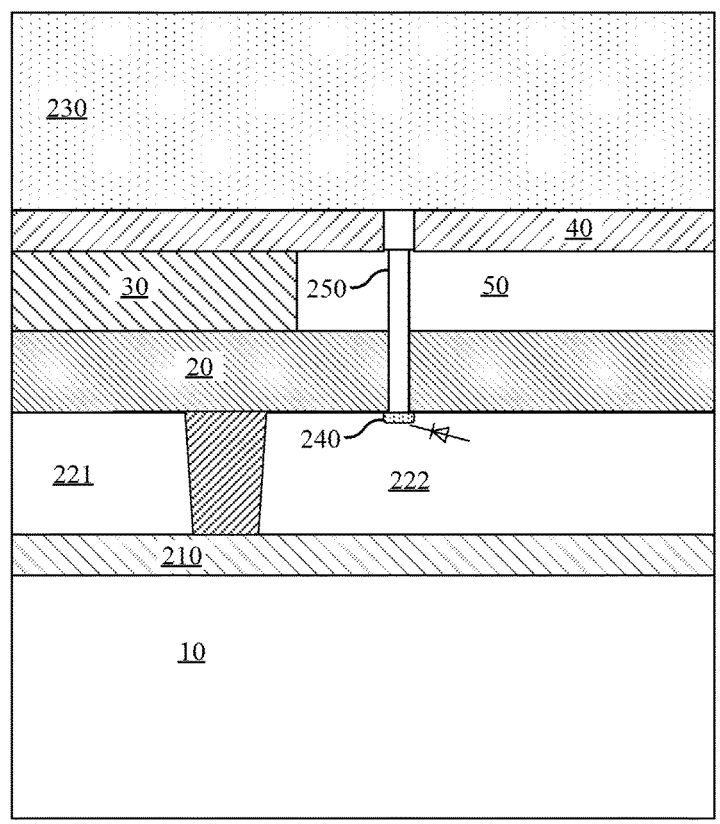

FIG. 6, which includes FIGS. 6A and 6B, illustrates a semiconductor device having a poly contact in accordance with an embodiment of the present invention.

As an illustration, the semiconductor device of FIG. 6 may be a temperature sensor. In various embodiments, the formation of contacts 250 enables the design of a temperature sensor within a power transistor such as power DMOS. The power transistor may include a second conductive line 221 formed over the substrate 10. The sensor may include a third conductive line 222 formed over the substrate 10. In one embodiment, the third conductive line 222 is a cathode terminal and the second conductive line 221 is an anode terminal of the sensor diode. The sensor is disposed proximate the power transistor and is able to monitor the temperature of the power transistor. For example, the diode current between the diode formed between the third conductive line 222 and the contacts 250 may be used to monitor the temperature in one embodiment.

In various embodiments, the connection between the first conductive line 50 to the third conductive line 222 may be made using the various embodiments of the present invention described above. The third conductive line 222 may be formed during the gate formation in other regions of the device, for example, a first poly silicon deposition followed by a lithography and etch process while the first conductive line 50 may be formed using a second poly silicon deposition. The first conductive line 50 and the third conductive line 222 may be coupled as output lines to a sensor control circuitry, which may be on the same chip, a different chip within the same package, or external to the package, for example, via a SENSE pin of the package.

The ability to form contacts having dimensions smaller than the minimum feature enables this design. For example, the first conductive line 50 and the third conductive line 222 may be both poly silicon lines. The formation of the contacts 250 may reduce the minimum feature size of this connection by about 20% (the exact size reduction will be technology dependent). Typically, a connection between the two conduction lines to be connected is made using two separate contacts each connected to a common metal layer covering the contacts. However, such a design places a number of design constraints. For example, the contact regions lie at a minimum distance from the edge of the first conductive line 50, they must be spaced apart from each other by a minimum distance, and the common metal layer has to overlap the contact holes by a given distance.

Using embodiments of the present invention, the contacts 250 may achieve the same functionality without imposing so many design constraints and while using a smaller foot print (area). As an example, the first conductive line 50 overlap with the third conductive line 222, with a first insulating layer 20, which may be an interlayer-dielectric, disposed vertically between and separating the first conductive line 50 from the third conductive line 222. A contact hole is formed through the first conductive line 50 and through the first insulating layer 20, reaching through to the third conductive line 222 as described in various embodiments, for example, see FIG. 5. This contact hole is then filled with the lower metal layer 110. In various embodiments, the only limits to the feature size of the contacts 250 are the minimum spacing from the contact window to the edge of each of the first conductive line 50 and the third conductive line 222.

Figure 7:
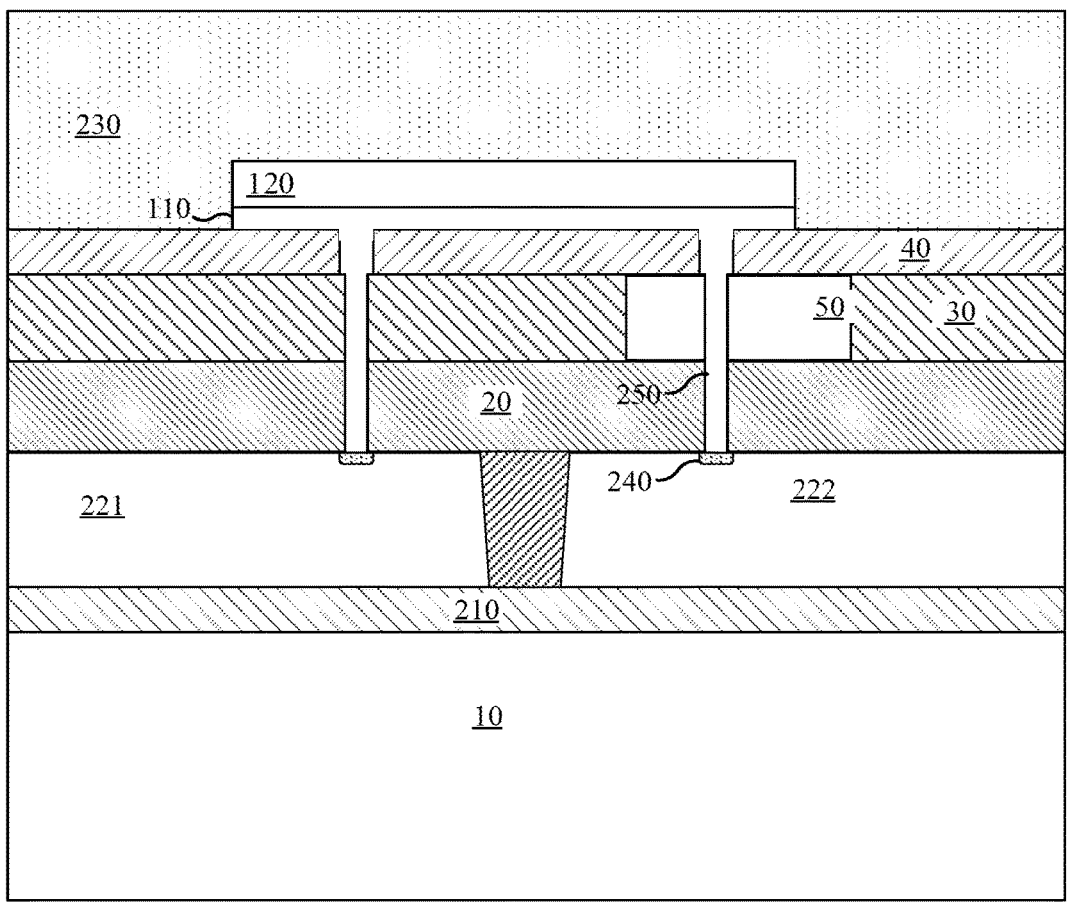
FIG. 7 illustrates a semiconductor device having a poly contact in accordance with an embodiment of the present invention.

FIG. 7 illustrates a semiconductor device having a poly contact in accordance with an embodiment of the present invention.

In this embodiment, the contacts 250 are further coupled to a common metal layer such as the upper metal layer 120 so that different regions of the semiconductor device are coupled. Thus, as an illustration, the second conductive line 221 is coupled to the third conductive line 222 along with the first conductive line 50 through the upper metal layer 120.

Accordingly, in various embodiments, a single metal process is used to form structures in two different levels. In particular, in various embodiments, the contact liner or a barrier metal is used to form underlying contact vias and/or structures for improving thermal conductivity that are smaller than the minimum feature size for the process technology being used to fabricate the semiconductor device.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-7 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a first contact pad disposed directly over a first active region at a top side of a workpiece;
a second contact pad disposed directly over a second active region at the top side of the workpiece;
an isolation region disposed between the first active region and the second active region, wherein the isolation region isolates the first active region from the second active region, wherein the workpiece comprises a major surface and wherein the first contact pad, the second contact pad, and the isolation region are disposed over the major surface;
a conductive layer disposed directly over the isolation region; and
a metal strip disposed directly over the isolation region, wherein the metal strip is disposed at least partially within the conductive layer, wherein the metal strip is not coupled to an external potential node, wherein the metal strip comprises a long narrow shape having a length extending along a direction parallel to the major surface of the workpiece.

2. The device of claim 1, further comprising:
a metal network disposed in the isolation region, the metal network comprising the metal strip.

3. The device of claim 2, wherein the metal network comprises a plurality of metal strips disposed within the isolation region.

4. The device of claim 1, wherein the first contact pad is configured to be coupled to a first external node, wherein the first contact pad is coupled to the first active region; and wherein a second contact pad is configured to be coupled to a second external node, wherein the second contact pad is coupled to the second active region.

5. The device of claim 4, wherein the first contact pad and the second contact pad are part of an external face of the semiconductor device.

6. The device of claim 4, wherein the isolation region comprises a semiconductor region.

7. The device of claim 1, wherein the first contact pad and the second contact pad comprise a first metal layer and a second metal layer disposed over the first metal layer.

8. The device of claim 7, wherein the first metal layer and the metal strip comprise a same material.

9. The device of claim 8, wherein the metal strip comprises a metal liner and a fill material.

10. The device of claim 7, wherein the thickness of the first metal layer is at least half the width of the metal strip.

11. The device of claim 7, wherein the width of the metal strip is less than a minimum feature for contact pad formation for the process technology used to fabricate the semiconductor device.

12. A semiconductor device comprising:
a first contact pad disposed at a top side of a workpiece comprising a semiconductor substrate;
a second contact pad disposed at the top side of the workpiece, wherein no other contact pad is disposed between the first contact pad and the second contact pad;
an isolation region disposed in the semiconductor substrate between the first contact pad and the second contact pad, wherein the workpiece comprises a major surface and wherein the first contact pad, the second contact pad, and the isolation region are disposed over the major surface;
a conductive layer disposed directly over the isolation region;
a first metal strip disposed at least partially within the conductive layer; and
a second metal strip disposed at least partially within the conductive layer, wherein the first metal strip and the second metal strip are disposed between the first contact pad and the second contact pad, wherein the first metal strip and the second metal strip are not coupled to an external potential node, wherein the first metal strip and the second metal strip comprise a long narrow shape having a length extending along a direction parallel to the major surface of the workpiece.

13. The device of claim 12, wherein the first metal strip is coupled to the second metal strip through a third metal strip oriented perpendicular to the first metal strip.

14. The device of claim 12, wherein the first contact pad and the second contact pad are part of an external face of the semiconductor device.

15. The device of claim 14, wherein the conductive layer comprises a top surface that is part of the external face of the semiconductor device.

16. The device of claim 12, wherein a width of the first metal strip is less than a width of the first contact pad.

17. The device of claim 12, wherein the first metal strip is coupled to the second metal strip by a metal feature disposed within the isolation region, the metal feature having a first region touching the first metal strip and a second region touching the second metal strip.

18. A semiconductor device comprising:
a first contact pad disposed directly over a first active region at a top side of a workpiece;
a second contact pad disposed directly over a second active region at the top side of the workpiece, the first contact pad and the second contact pad comprising a lower metal layer of a first material and a upper metal layer of a second material disposed over the lower metal layer;
a conductive layer comprising a third material disposed between the first contact pad and the second contact pad, the first contact pad, the second contact pad, and the conductive layer being part of an exposed surface of the semiconductor device; and
a first metal strip disposed at least partially within the conductive layer, wherein the first metal strip is not coupled to an external potential node, wherein the first metal strip comprises a long narrow shape having a length and a width smaller than the length in a plane parallel to a major surface of the workpiece, wherein the first metal strip comprises the first material; and
a second metal strip disposed at least partially within the conductive layer, wherein the second metal strip is not coupled to an external potential node, wherein the second metal strip comprises a long narrow shape having a length and a width smaller than the length in the plane parallel to the major surface of the workpiece, wherein the second metal strip comprises the first material.

19. The device of claim 18, further comprising:
a metal network disposed at least partially within the conductive layer, the metal network comprising the first metal strip and the second metal strip.

20. The device of claim 18, wherein the first metal strip is coupled to the second metal strip through a third metal strip oriented perpendicular to the first metal strip.

* * * * *